United States Patent
Silverbrook

(10) Patent No.: US 6,435,664 B2
(45) Date of Patent: Aug. 20, 2002

(54) NOZZLE ARRANGEMENT THAT INCLUDES A THERMAL ACTUATOR FOR AN INK JET PRINTHEAD

(75) Inventor: Kia Silverbrook, Balmain (AU)

(73) Assignee: Silverbrook Research Pty Ltd, Balmain (AU)

(*) Notice: Subject to any disclaimer, the term of this patent is extended or adjusted under 35 U.S.C. 154(b) by 0 days.

(21) Appl. No.: 09/874,757

(22) Filed: Jun. 5, 2001

Related U.S. Application Data

(63) Continuation-in-part of application No. 09/112,767, filed on Jul. 10, 1998, application No. 09/112,802, filed on Jul. 10, 1998, now Pat. No. 6,213,589, application No. 09/112,778, filed on Jul. 10, 1998, application No. 09/112,815, filed on Jul. 10, 1998, now Pat. No. 6,247,792, application No. 09/113,096, filed on Jul. 10, 1998, now Pat. No. 6,264,307, application No. 09/113,068, filed on Jul. 10, 1998, now Pat. No. 6,254,220, application No. 09/113,095, filed on Jul. 10, 1998, now Pat. No. 6,234,611, application No. 09/112,808, filed on Jul. 10, 1998, now Pat. No. 6,302,528, application No. 09/112,890, filed on Jul. 10, 1998, now Pat. No. 6,283,582, application No. 09/112,780, filed on Jul. 10, 1998, now Pat. No. 6,239,821, application No. 09/113,083, filed on Jul. 10, 1998, application No. 09/112,793, filed on Jul. 10, 1998, application No. 09/112,794, filed on Jul. 10, 1998, application No. 09/113,128, filed on Jul. 10, 1998, now Pat. No. 6,293,653, application No. 09/113,127, filed on Jul. 10, 1998, now Pat. No. 6,312,107, application No. 09/112,756, filed on Jul. 10, 1998, now Pat. No. 6,227,653, application No. 09/112,755, filed on Jul. 10, 1998, now Pat. No. 6,234,609, application No. 09/112,754, filed on Jul. 10, 1998, now Pat. No. 6,238,040, application No. 09/112,811, filed on Jul. 10, 1998, now Pat. No. 6,188,415, application No. 09/112,812, filed on Jul. 10, 1998, now Pat. No. 6,227,654, application No. 09/112,813, filed on Jul. 10, 1998, now Pat. No. 6,209,989, application No. 09/112,814, filed on Jul. 10, 1998, now Pat. No. 6,247,791, application No. 09/112,764, filed on Jul. 10, 1998, application No. 09/112,765, filed on Jul. 10, 1998, now Pat. No. 6,217,153, application No. 09/112,767, filed on Jul. 10, 1998, application No. 09/112,768, filed on Jul. 10, 1998, now Pat. No. 6,243,113, application No. 09/112,807, filed on Jul. 10, 1998, now Pat. No. 6,283,581, application No. 09/112,806, filed on Jul. 10, 1998, now Pat. No. 6,247,790, application No. 09/112,820, filed on Jul. 10, 1998, now Pat. No. 6,260,953.

(30) Foreign Application Priority Data

Mar. 25, 1998 (AU) .............................. PO2592

(51) Int. Cl.$^7$ .......................... B41J 2/015; B41J 2/135; B41J 2/04
(52) U.S. Cl. ............................. 347/54; 347/20; 347/44; 347/47
(58) Field of Search ............................. 347/20, 44, 47, 347/54

(56) References Cited

FOREIGN PATENT DOCUMENTS

| JP | 403292147 A | * 12/1991 | .................. 347/68 |
|---|---|---|---|
| JP | 404001051 A | 1/1992 | |
| JP | 411034328 A | * 2/1999 | .................. 347/20 |

* cited by examiner

Primary Examiner—John Barlow
Assistant Examiner—An H. Do

(57) ABSTRACT

A nozzle arrangement for an ink jet printhead includes a substrate. An actuator is arranged on the substrate for ejecting ink from a nozzle chamber of the nozzle arrangement. The actuator includes an actuating member having an anchored portion that is anchored to the substrate and a working portion that is movable with respect to the substrate. The actuating member incorporates a material having a coefficient of thermal expansion which is such that, when heated, the working portion is capable of expansion and consequent movement sufficient to perform work. A heating device is positioned in, and in contact with, the working portion to heat the working portion.

14 Claims, 7 Drawing Sheets

NOZZLE ARRANGEMENT THAT INCLUDES A THERMAL ACTUATOR FOR AN INK JET PRINTHEAD

REFERENCES TO U.S. APPLICATIONS

This application is a continuation-in-part application of U.S. application Ser. No. 09/112,767 filed Jul. 10, 1998. U.S. application Ser. Nos. 09/112,802 now U.S. Pat. No. 6,213, 589, 09/112,778, 09/112,815 now U.S. Pat. No. 6,247,792, 09/113,096 now U.S. Pat. No. 6,264,307, 09/113,068 now U.S. Pat. No. 6,254,220, 09/113,095 now U.S. Pat. No. 6,234,611, 09/112,808 now U.S. Pat. No. 6,302,528, 09/112, 809 now U.S. Pat. No. 6,283,582, 09/112,780 now U.S. Pat. No. 6,239,821, 09/113,083 09/112,793, 09/112,794, 09/113, 128 now U.S. Pat. No. 6,293,653, 09/113,127 now U.S. Pat. No. 6,312,107, 09/112,756 now U.S. Pat. No. 6,227,653, 09/112,755 now U.S. Pat. No. 6,234,609, 09/112,754 now U.S. Pat. No. 6,238,040, 09/112,811 now U.S. Pat. No. 6,188,415, 09/112,812 now U.S. Pat. No. 6,227,654, 09/112, 813 now U.S. Pat. No. 6,209,989, 09/112,814 now U.S. Pat. No. 6,247,791, 09/112,764, 09/112,765 now U.S. Pat. No. 6,217,153, 09/112,767, 09/112,768 now U.S. Pat. No. 6,243, 113, 09/112,807 now U.S. Pat. No. 6,283,581, 09/112,806 now U.S. Pat. No. 6,247,790 and 09/112,820 now U.S. Pat. No. 6,260,953 are hereby incorporated by reference.

FIELD OF THE INVENTION

This invention relates to ink jet printheads. More particularly, this invention relates to a nozzle arrangement that includes a thermal actuator for an ink jet printhead

BACKGROUND TO THE INVENTION

Applicant has invented an ink jet printhead that is capable of generating text and images at a resolution of up to 1600 dpi.

In order to achieve this, the Applicant has made extensive use of micro electro-mechanical systems technology. In particular, the Applicant has developed integrated circuit fabrication techniques suitable for the manufacture of such printheads.

As a result of the fabrication techniques developed by the Applicant, it has become possible for the Applicant to fabricate printheads that contain up to 84000 nozzle arrangements. In most of these embodiments, each nozzle arrangement includes one or more moving components which act on ink in a nozzle chamber to eject that ink from the nozzle chamber.

Applicant has spent a substantial amount of time and effort in developing a suitable actuator to drive these moving components. Applicant has found that significant problems exist with respect to prior art actuators, such as those which incorporate a buckle plate. The buckle plate mechanism is based on the principle of the buckling of a member in order to achieve rapid enough movement in one direction for the creation of an ink drop and subsequent movement in an opposite direction to separate that ink drop from a body of ink within a nozzle chamber. In order to achieve this, the buckle plate is fast with a substrate at its periphery. The buckle plate is then heated and the resultant expansion results in the buckle plate "popping out" to accommodate this expansion. This "popping" movement is used to achieve drop ejection. Upon cooling of the buckle plate, the buckle plate returns to its original configuration to create a "suck back" effect, thereby facilitating the separation of the ink drop from the remainder of the ink in the nozzle chamber.

Applicant has found through extensive research and development, that the buckle plate uses too much energy in order to be utilized in a printhead of the type described above. In particular, the Applicant has found that the amount of energy required to achieve the buckling of the plate is simply excessive when applied to each of the many thousands of nozzle arrangements required to achieve a pagewidth printhead capable of the high resolution mentioned above.

Accordingly, the Applicant has conceived the invention in order to achieve an actuator which can be manufactured according to an integrated circuit fabrication technique and which is efficient enough to be used in such a printhead.

SUMMARY OF THE INVENTION

According to a first aspect of the invention, there is provided a nozzle arrangement for an ink jet printhead, the nozzle arrangement comprising a substrate; and an actuator that is arranged on the substrate for ejecting ink from a nozzle chamber of the nozzle arrangement, the actuator comprising at least one actuating member having an anchored portion that is anchored to the substrate and a working portion that is movable with respect to the substrate, the, or each, actuating member incorporating a material having a coefficient of thermal expansion which is such that, when heated, the, or each, working portion is capable of expansion and consequent movement sufficient to perform work; and at least one heating device that is positioned in, and in contact with, the, or each respective, working portion to heat the, or each, working portion.

According to a second aspect of the invention, there is provided a nozzle arrangement for an ink jet printhead, the nozzle arrangement comprising a substrate; and an actuator that is arranged on the substrate for ejecting ink from a nozzle chamber of the nozzle arrangement, the actuator comprising at least one actuating member having an anchored portion that is anchored to the substrate and an end portion that is movable with respect to the substrate, the, or each, actuating member incorporating a material having a coefficient of thermal expansion which is such that, when heated, the, or each, actuating member is capable of expansion with consequent movement of the end portion being sufficient to perform work; and a heating device that is operatively positioned with respect to the, or each, actuating member to heat the, or each, actuating member.

According to a third aspect of the invention, there is provided an ink jet printhead that comprises a substrate; and at least one nozzle arrangement that is arranged on the substrate, the, or each, nozzle arrangement comprising an actuator that is arranged on the substrate for ejecting ink from a nozzle chamber of the nozzle arrangement, the actuator comprising at least one actuating member having an anchored portion that is anchored to the substrate and a working portion that is movable with respect to the substrate, the, or each, actuating member incorporating a material having a coefficient of thermal expansion which is such that, when heated, the, or each, working portion is capable of expansion and consequent movement sufficient to perform work; and at least one heating device that is positioned in, and in contact with, the, or each respective, working portion to heat the working portion.

According to a fourth aspect of the invention, there is provided an ink jet printhead that comprises a substrate; and at least one nozzle arrangement that is arranged on the substrate, the, or each, nozzle arrangement comprising an actuator that is arranged on the substrate for ejecting ink from a nozzle chamber of the nozzle arrangement, the actuator comprising at least one actuating member having an anchored portion that is anchored to the substrate and an end portion that is movable with respect to the substrate, the, or each, actuating member incorporating a material having a coefficient of thermal expansion which is such that, when heated, the, or each, actuating member is capable of expansion with consequent movement of the end portion being sufficient to perform work; and a heating device that is operatively positioned with respect to the, or each, actuating member to heat the, or each, actuating member.

The invention is described below, by way of example only, with reference to the accompanying drawings. The specific nature of the following description should not be regarded as limiting in any way the broad scope of this summary.

DETAILED DESCRIPTION OF THE INVENTION

Figure 1:
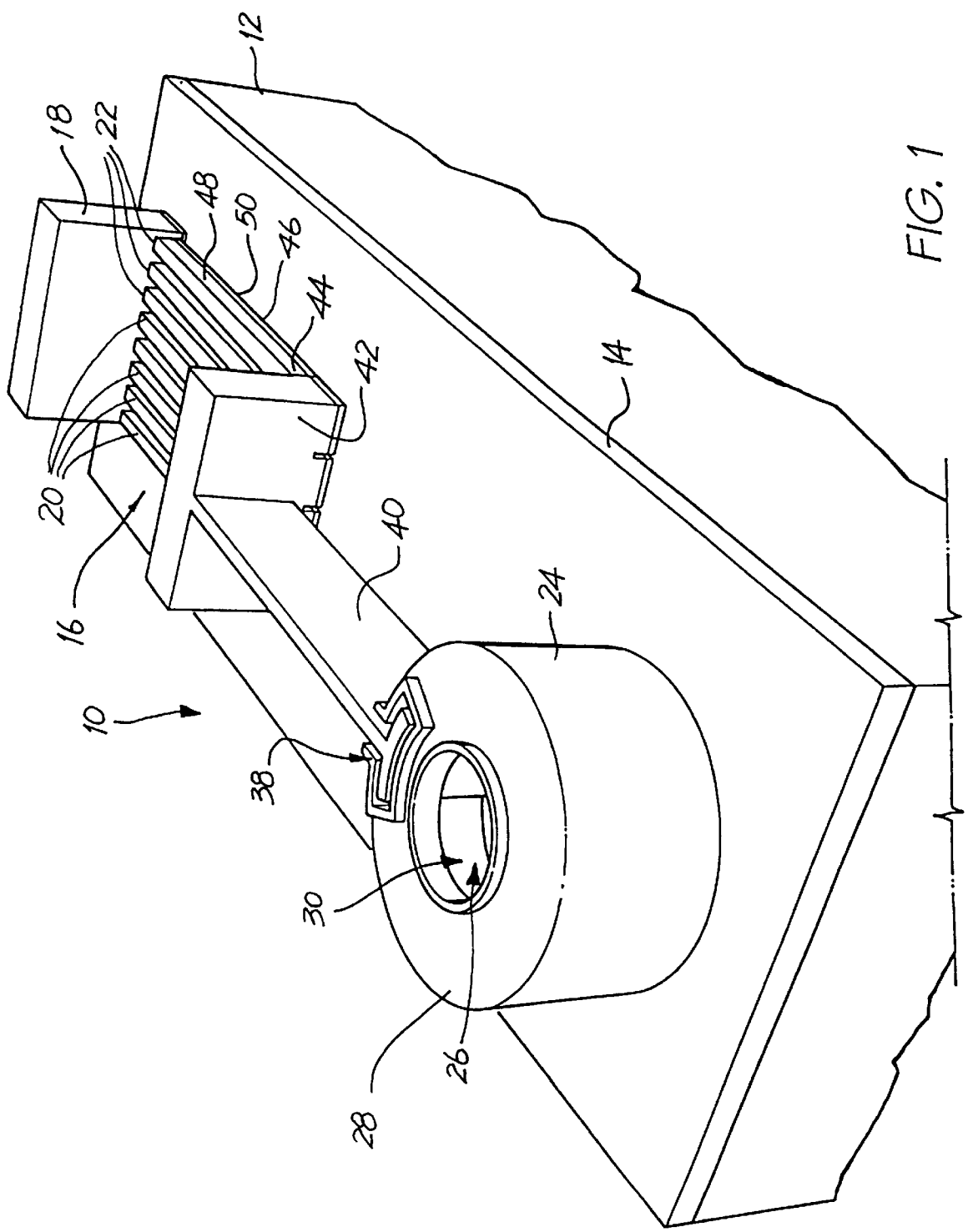
FIG. 1 shows a schematic, three dimensional view of a first embodiment of a nozzle arrangement, in accordance with the invention, for use with a printhead.

In FIGS. 1 to 4, reference numeral 10 generally indicates a first embodiment of a nozzle arrangement, in accordance with the invention, for an ink jet printhead.

The nozzle arrangement 10 includes a wafer substrate 12. A drive circuitry layer 14 is formed on the wafer substrate 12.

The nozzle arrangement 10 includes a thermal actuator 16 that is formed on the drive circuitry layer 14 to be electrically connected to the drive circuitry layer 14. The actuator 16 includes a support post 18. A plurality of actuating members or arms 20 are each fast with the support post 18 at a first end 22.

A cylindrical nozzle chamber wall 24 is formed on the layer 14 to define a nozzle chamber 26. A roof wall 28 is formed on the cylindrical wall 24 to define an ink ejection port 30. The nozzle chamber 26 is in fluid communication with an ink inlet channel 32 that is etched through the wafer substrate 12 and the drive circuitry layer 14.

Figure 2:
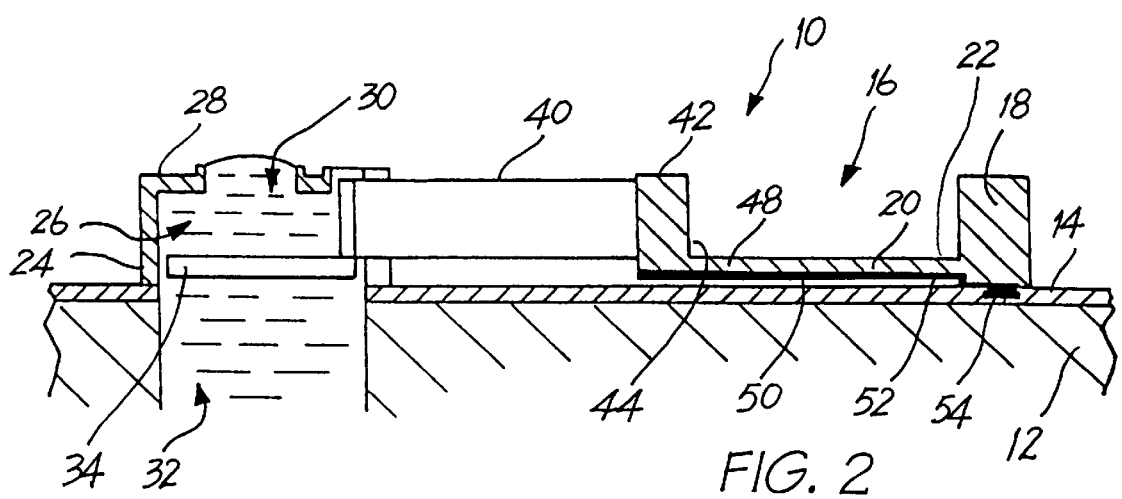
FIG. 2 shows a schematic side view of the nozzle arrangement of FIG. 1 in a quiescent condition.
Figure 3:
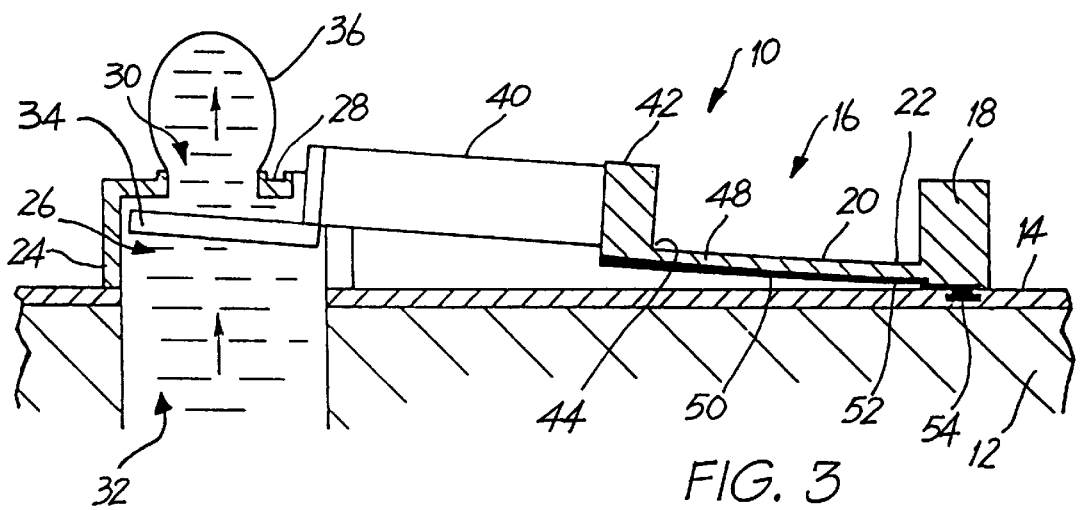
FIG. 3 shows a schematic side view of the nozzle arrangement of FIG. 1 in an active condition.
Figure 4:
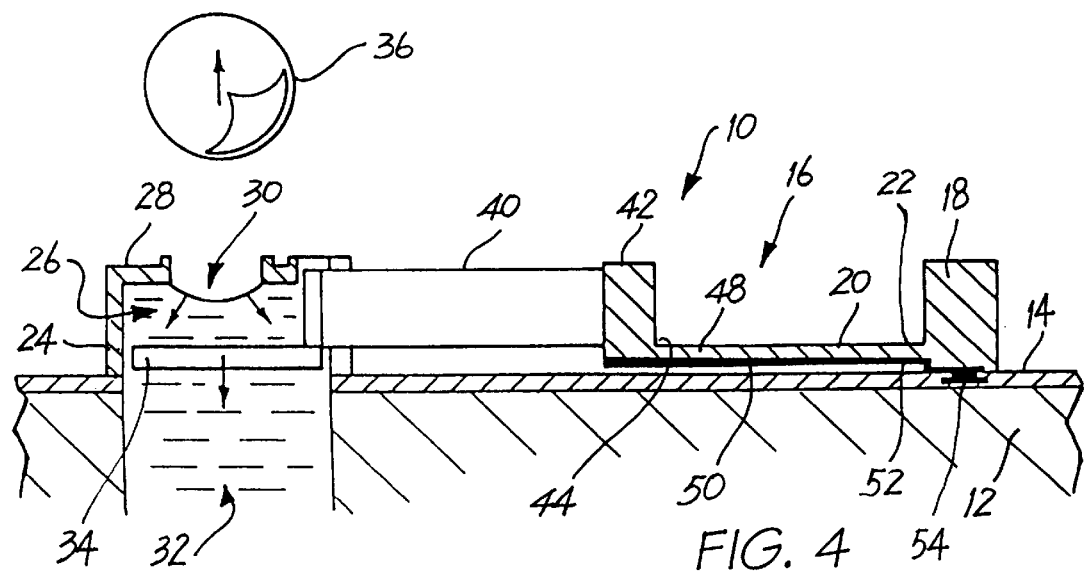
FIG. 4 shows a schematic side view of the nozzle arrangement of FIG. 1, immediately after the ejection of a drop of ink from the nozzle arrangement.

An ink ejection member in the form of a paddle 34 is positioned in the nozzle chamber 26 to be displaceable between a quiescent position as shown in FIGS. 2 and 4 and an operative position as shown in FIG. 3 to eject a drop of ink 36 from the ink ejection port 30.

The nozzle chamber wall 24 has a slotted opening 38 defined therein. The paddle 34 is connected to a paddle arm 40 which extends through the slotted opening 38 and terminates at a mounting formation 42. The mounting formation 42 is connected to a second end 44 of each actuating arm 20. It will thus be appreciated that displacement of each second end 44 away from the drive circuitry layer 14 will result in movement of the paddle 34 towards the ink ejection port 30 to form the drop of ink 36.

Each actuating arm 20 defines a working portion 46 which is moveable with respect to the layer 14. In this case, each actuating arm 20 is capable of being bent away from the drive circuitry layer 14.

Each actuating arm 20 includes a bending arm 48. Each bending arm 48 is of a resiliently flexible material. In particular, each bending arm 48 is substantially of a silicon dioxide material, in particular, amorphous silicon dioxide which is also known as glass.

Each actuating arm 20 includes a heating device in the form of a layer 50 of conductive material. The layer 50 is of a suitable resistance so that when an electrical current is applied to the layer 50, resistive heating of the layer 50 takes place. In particular, the layer 50 can be of such materials as a copper nickel alloy or a titanium nitride.

It is to be appreciated that the materials mentioned here are merely examples and that other suitable materials may very well be utilized to achieve the same effect.

In spite of the fact that other materials can be utilized, a necessary constraint is that the layer 50 must expand to a suitably greater extent than the bending arm 48 so that the layer 50 acts on the bending arm 48 to bend the arm 48 away from the drive circuitry layer 14.

It will be appreciated that it is desirable that actual bending of the arm 48 is concentrated at a region proximate the support posts 18. Thus, the layer 50 is formed to define a thinner portion 52 proximate the support post 18. As a result, the portion 52 is resistively heated to a greater extent than the remaining portion of the layer 50 so that the thinner portion 52 expands to a greater extent. This results in a maximum bending force being applied to the bending arm 48 at a region proximate the support post 18.

It should be noted that it is important to achieve both a rapid bending movement and a rapid return to a normal condition. The reason for this is that the return must be sufficiently fast so that suitable necking and separation of the drop 36 can take place as the paddle 34 draws a portion of the ink back into the nozzle chamber 26. It follows that the materials used for the manufacture of the actuating arms 20 should be selected extremely carefully. Furthermore, the materials should preferably be those which are suitable for use in integrated circuit fabrication processes.

The Applicant has developed an equation for bend efficiency to use as a means for determining whether or not certain materials are suitable for use in the manufacture of the actuating arms 20. The equation reads as follows:

bend efficiency=(Young's modulus×coefficient of thermal expansion squared)/(density×specific heat capacity).

In general, the Applicant has found that by initially selecting, through trial and error, a suitable material, that material can be measured to achieve a standard for bend efficiency according to the above equation. Then, by using the equation, the Applicant can select various other materials which may or may not be suitable for use in the manufacture of the nozzle arrangement 10 by comparing their bend efficiencies with those obtained with said suitable material. Further detail of the use of this equation is described in the referenced material and is therefore not set out here.

The layer of conductive material 50 is connected at 54 to the drive circuitry layer 14 so that operation of the actuating arms 20 can be controlled with a suitable control system via the drive circuitry layer 14.

Figure 5:
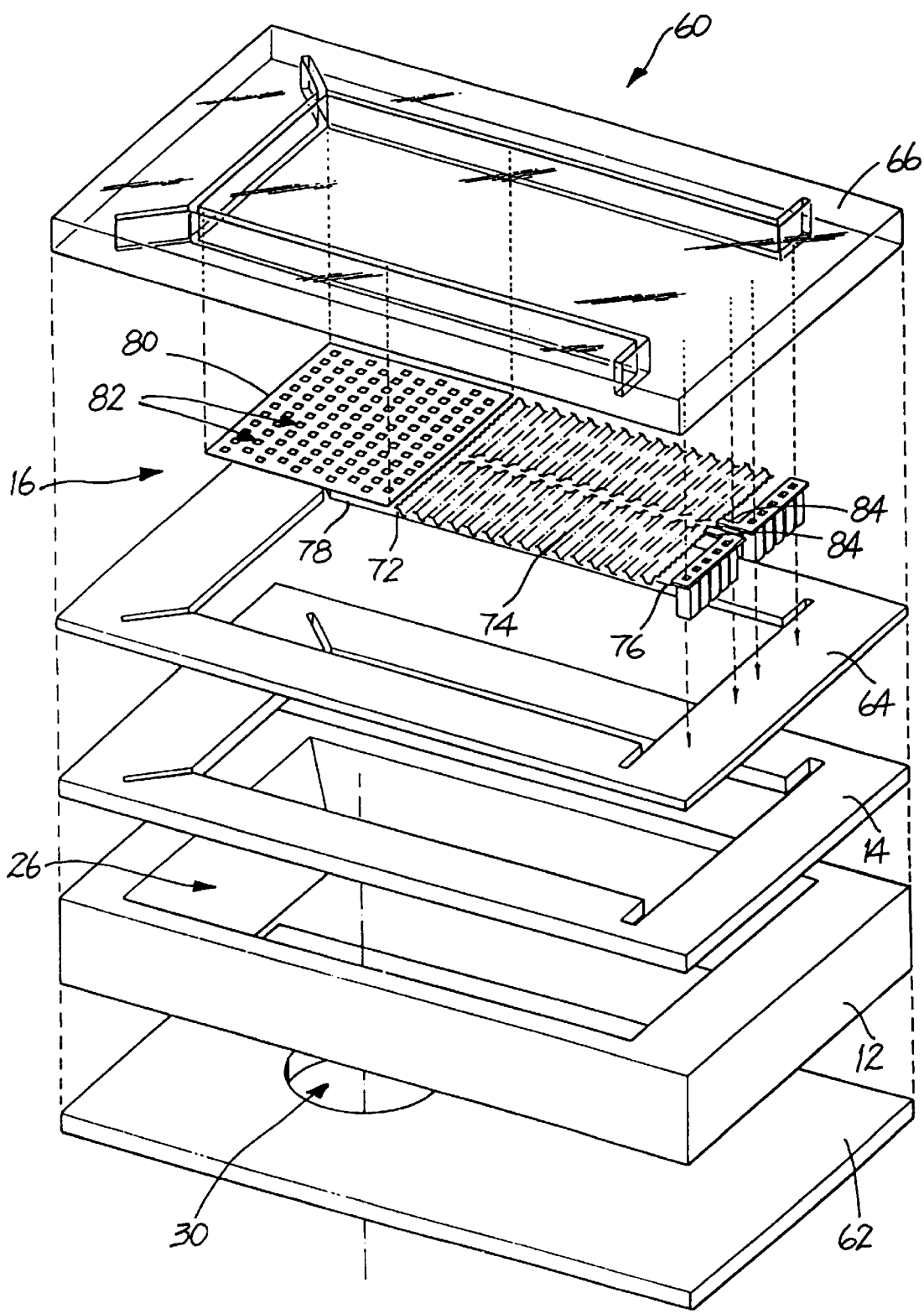
FIG. 5 shows a schematic exploded view of a second embodiment of a nozzle arrangement, in accordance with the invention, for an ink jet printhead.
Figure 6:
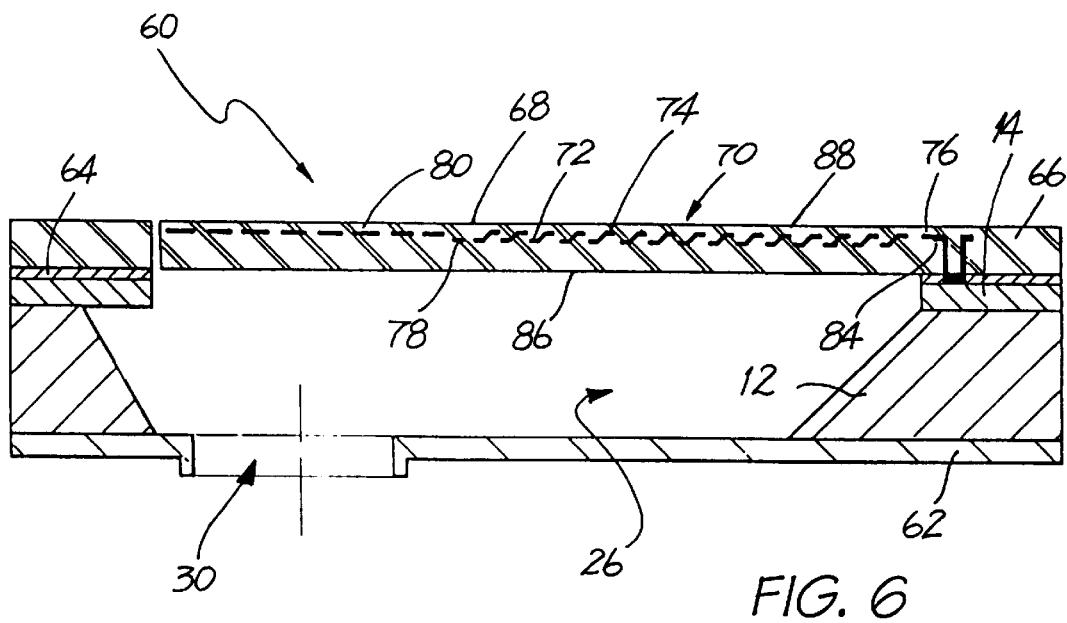
FIG. 6 shows a schematic sectioned side view of the nozzle arrangement of FIG. 5 in a quiescent condition.
Figure 7:
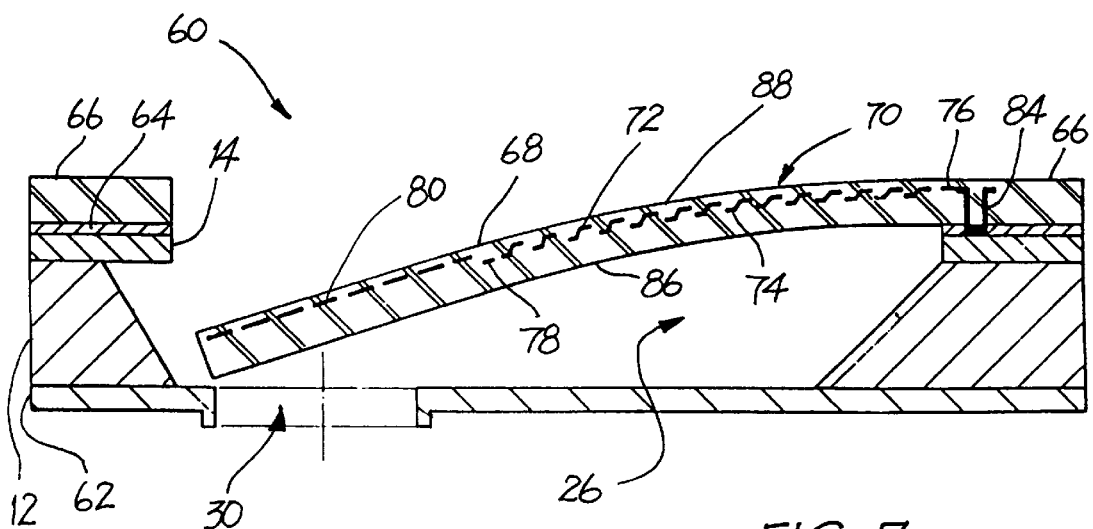
FIG. 7 shows a schematic sectioned side view of the nozzle arrangement of FIG. 5 in an operative condition.
Figure 8:
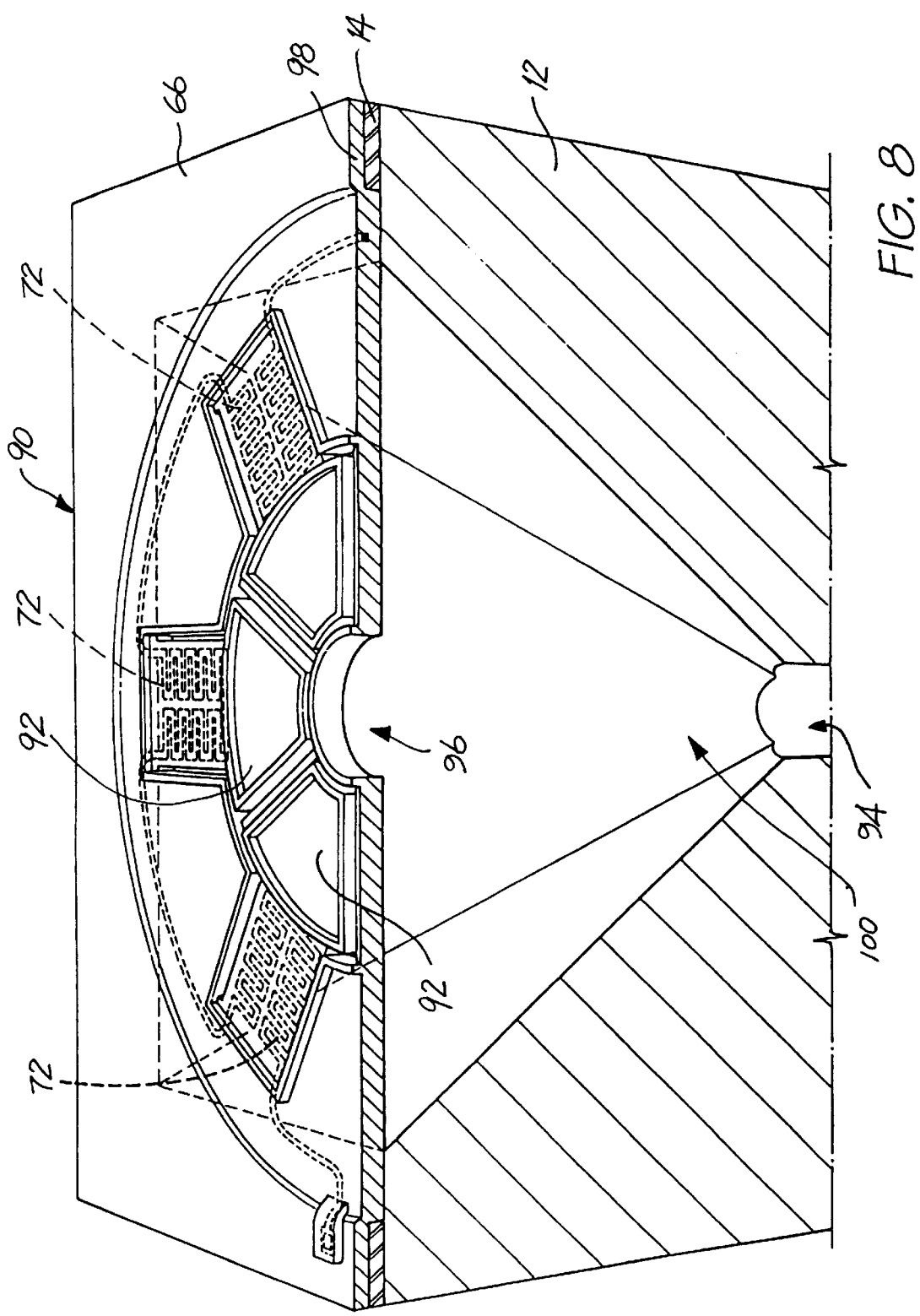
FIG. 8 shows a sectioned view of a third embodiment of a nozzle arrangement, in accordance with the invention, for an ink jet printhead.
Figure 9:
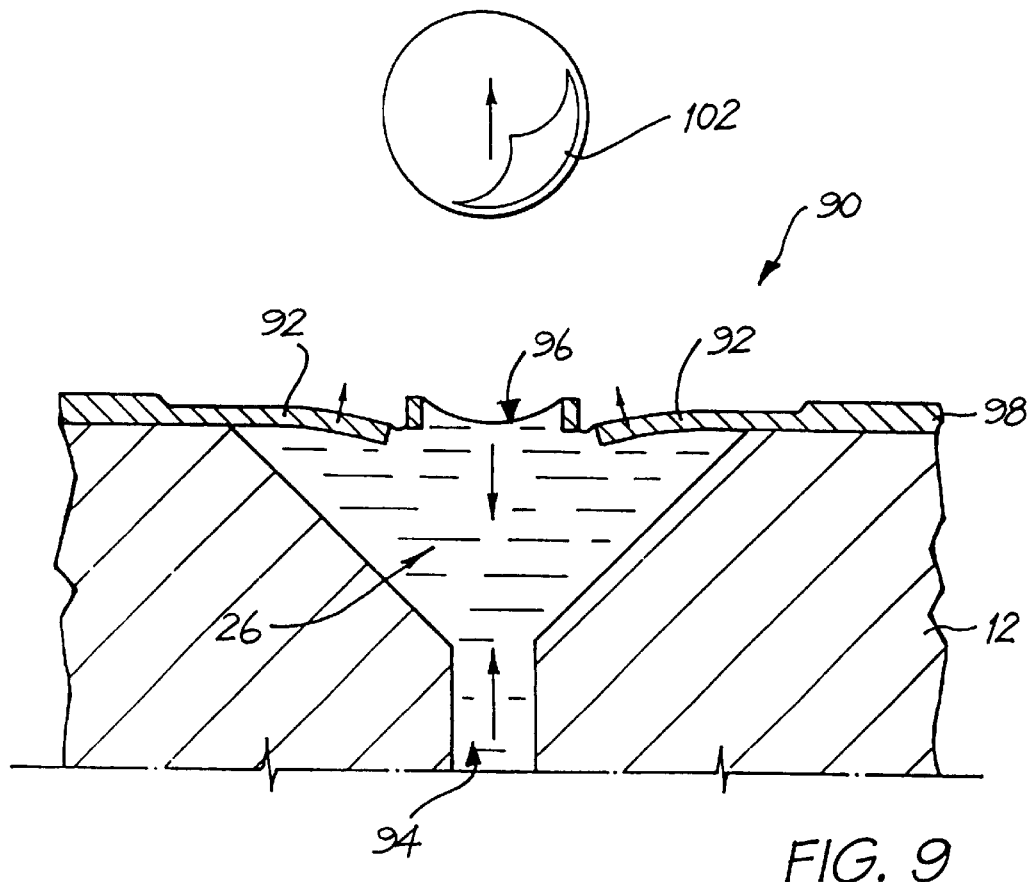
FIG. 9 shows a schematic side sectioned view of the nozzle arrangement of FIG. 8 immediately after the ejection of a drop of ink from the nozzle arrangement.
Figure 10:
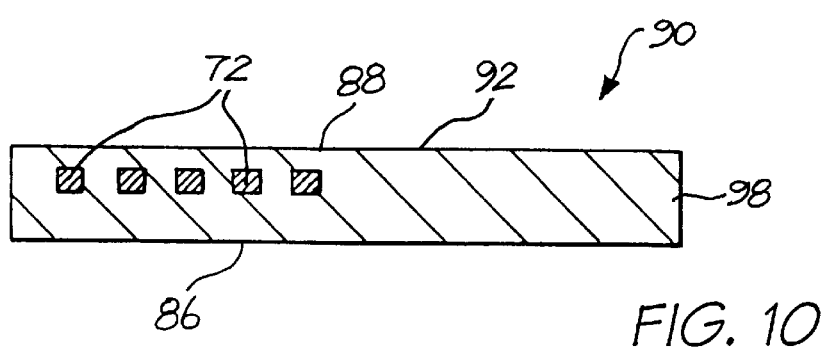
FIG. 10 shows a schematic side sectioned view of an actuating member of the nozzle arrangement of FIG. 9 in a quiescent condition.
Figure 11:
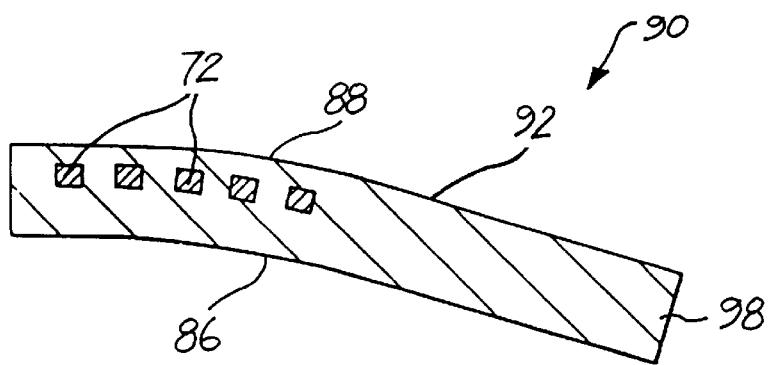
FIG. 11 shows the actuating member of FIG. 10 in an operative condition.

In FIGS. 5 to 7, reference numeral 60 generally indicates a second embodiment of a nozzle arrangement, in accordance with the invention, for an ink jet printhead. With reference to FIGS. 1 to 4, like reference numerals refer to like parts, unless otherwise specified.

In this embodiment, the nozzle chamber 26 is etched into the wafer substrate 12. An etch stop layer 62 is positioned on the wafer substrate 12, opposite the drive circuitry layer 14 to define the roof wall 28. The ink ejection port 30 is thus defined by the etch stop layer 62. A passivation layer 64 is positioned on the drive circuitry layer 14. A layer of expansion material 66 is positioned on the passivation layer 64. The expansion material 66 has a coefficient of thermal expansion which is such that, when heated, the expansion material 66 is capable of expansion to an extent sufficient to perform work.

The layer 66 is etched to define an actuating member 68 which spans an inlet 70 of the nozzle chamber 26.

The expansion material 66 is also resiliently flexible and has a Young's modulus which is such that, subsequent to bending, the actuating member 68 can return to an original position at a desired speed. In particular, the expansion material 66 is selected from the group of materials having a coefficient of expansion of greater than $5 \times 10^{-6}$. The group of materials are constrained in that, in addition to the range of coefficients of thermal expansion, they should also have a Young's modulus of greater than one gigapascal. Still further, the materials should preferably be those which can be readily used in integrated circuit fabrication techniques.

In this example, the expansion material 66 is of a polytetrafluoroethylene (PTFE). A heating device 72 is embedded in the expansion material 66 of the actuating member 68. The heating device 72 is of a conductive material. In particular, the heating device 72 includes a resistive heating portion 74 which is heated when a suitable current is passed through the portion 74. One end 76 of the portion 74 is fixed to the drive circuitry layer 14. An opposed end 78 is fixed to a planar element 80 which is of a rigid conductive material to provide the actuating member with a desired level of rigidity. The planar element 80 has a plurality of openings 82 defined therein. This serves to ensure that PTFE on both sides of the planar element 80 can be connected via the openings 82 thereby inhibiting de-lamination of the PTFE and the heating device 72.

As can be seen from the drawings, the resistive heating portion 74 is corrugated and is generally coplanar with the element 80. It will be appreciated that the corrugated nature of the resistive heating portion 74 enhances resistive heating and also enhances the integrity of the actuating member 68. The fixed end 76 is fixed to the drive circuitry layer 14 with suitable vias 84.

The resistive heating portion 74 is also resiliently flexible. In particular, the material of the resistive heating portion 74 is selected to have a Young's modulus which is such that the actuating member 68 can return to a quiescent condition when the expansion material 66 is cooled.

The actuating member 68 is generally planar having one side 86 closer to the ink ejection port 30 than an opposed side 88. As can be seen in FIGS. 6 and 7, the heating device 72 is positioned closer to the side 88 than to the side 86. It will therefore be appreciated that a portion of the expansion material 66 close to the opposed side 88 will be heated to a greater degree than a portion closer to the side 86. Thus, expansion of the material 66 is uneven resulting in the actuating member 68 bending, as shown in FIG. 7, towards the ink ejection port 30.

Thermal expansion on a macroscopic scale is generally recognized as a relatively slow process. However, Applicant has found by selecting suitable expansion material, such as PTFE and suitable heating material such as copper nickel alloys or titanium nitride, expansion takes place fast enough to eject a drop of ink from the ink ejection port 30. Further, by selecting appropriate materials, the actuating member 68 can return to its quiescent condition rapidly enough to facilitate separation of ink from the ink drop. This is largely due to the fact that the components are microscopic and, as a result, heat transfer is significantly more rapid than that which would occur on a macroscopic scale.

In FIGS. 8 to 11, reference numeral 90 generally indicates a third embodiment of a nozzle arrangement, in accordance with the invention, for an ink jet printhead. With reference to FIGS. 1 to 7, like reference numerals refer to like parts, unless otherwise specified.

In this embodiment, the nozzle chamber 26 is formed in the wafer substrate 12 with a crystallographic etch so that the nozzle chamber 26 tapers inwardly towards an inlet channel 94 defined in the wafer substrate 12.

In this embodiment, instead of a single actuating member 68, the nozzle arrangement 90 incorporates a number of radially spaced actuators 92 which are positioned about and extend towards an ink ejection port 96 defined in a layer 98 of the expansion material 66 formed on the wafer substrate 12 with a deposition and etching process.

Each actuator 92 operates in substantially the same manner as the actuating member 68.

However, in this embodiment, instead of ejecting the ink directly from the nozzle chamber 26, the actuators 92 are urged into the nozzle chamber 26 on the application of a current to each heating device 72. This serves to reduce a volume 100 defined by the nozzle chamber 26 thereby resulting in the ejection of a drop 102 of ink from the nozzle chamber 26. This operation is clearly shown in FIGS. 9 to 11.

Figure 12:
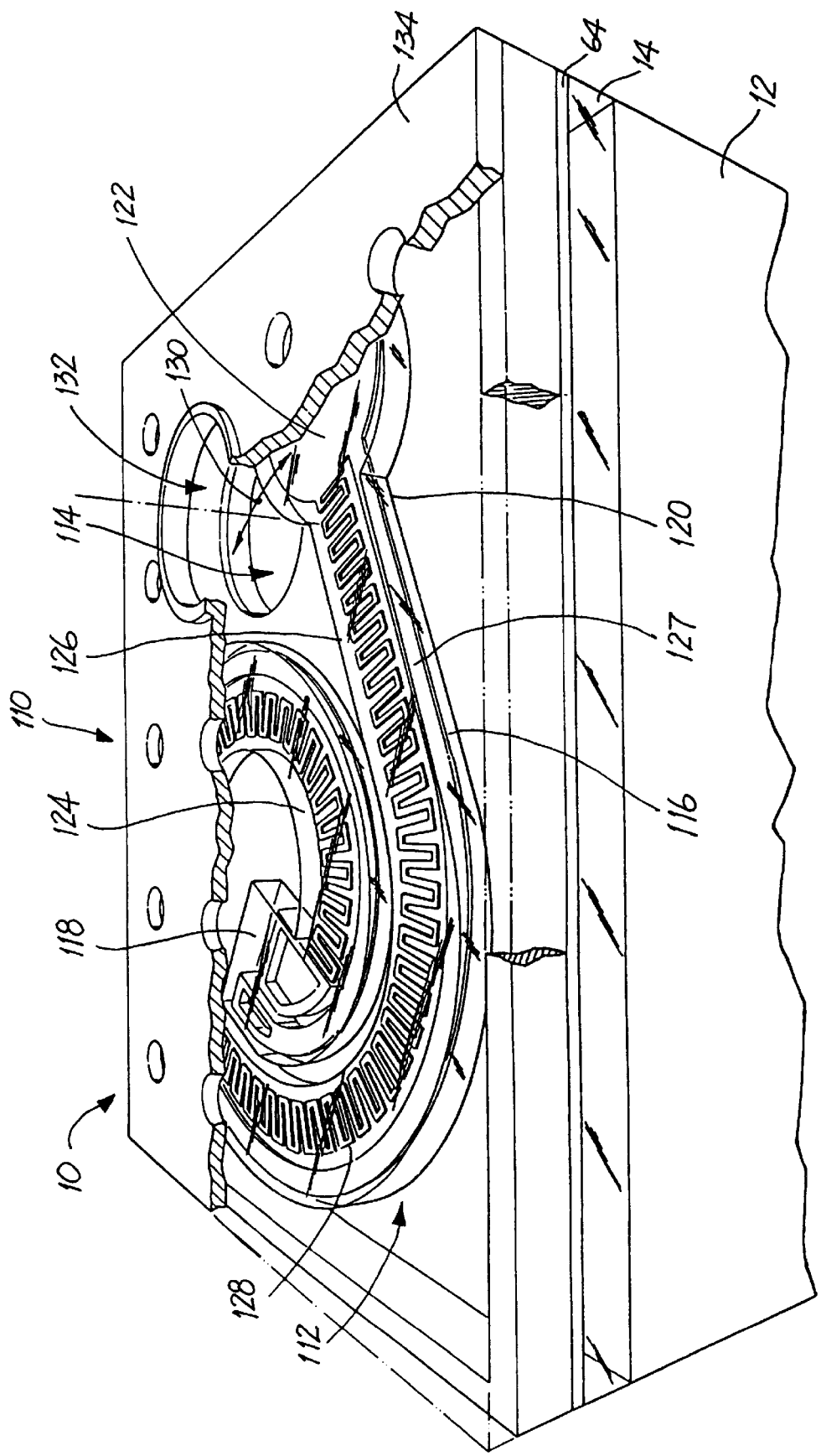
FIG. 12 shows a fourth embodiment of a nozzle arrangement, in accordance with the invention, for an ink jet printhead.

In FIG. 12, reference numeral 110 generally indicates a fourth embodiment of a nozzle arrangement, in accordance with the invention, for an ink jet printhead. With reference to FIGS. 1 to 11, like reference numerals refer to like parts, unless otherwise specified.

The nozzle arrangement 110 includes a coiled actuator 112 that is positioned operatively with respect to an inlet 114 of the nozzle chamber 26. In particular, the actuator 112 includes a coiled arm 116 having an inner end 118 fast with the drive circuitry layer 14 and an outer end 120 connected to a shutter member 122. The coiled arm 116 has a generally rectangular cross section with a pair of major sides 124 substantially parallel to the wafer substrate 12 and a pair of opposed minor sides 126. A heater element 128 is embedded in the coiled arm 116 proximate an inner minor side 126.

The coiled arm 116 is of the expansion material described above. The heater element 128 is of the conductive material, also described above. Further, the heater element 128 has a convoluted or serpentine configuration to accommodate movement of the coiled arm 116. It will thus be appreciated that, because of the positioning of the heater element 128, on the application of a current to the heater element 128, the uneven heating of the coiled arm 116 will result in a partial uncoiling of the arm 116. Thus, by controlling the current which is supplied to the heater element 28 with a suitable control system via the drive circuitry layer 14, the shutter member 122 can be made to move in the direction indicated by the arrow 130. Thus, in a suitable configuration, the shutter member 122 can be driven between a closed condition in which the shutter member 122 serves to close the inlet 114 and an open condition in which the ink is free to flow through the inlet 114 and into the nozzle chamber 26.

The configuration of this example is usually used with the inlet 114 in fluid communication with an ink reservoir (not shown). Ink within the reservoir is provided with a pulsating pressure which is sufficiently strong to eject ink from an ink ejection port 132 defined in a roof wall 134 of the nozzle arrangement 110. It will thus be appreciated that selective drop ejection can be achieved by controlling operation of the coiled actuator 112 with a suitable control system connected to drive circuitry within the layer 14.

The Applicant believes that this invention provides a means whereby a moving component in a nozzle chamber can be provided at an energy rate which is substantially less than that presently available. Further, it is clear that the actuator of this invention is a relatively simple structure and would lend itself to planar fabrication techniques which are the basis of integrated circuit manufacture. The actuator is also relatively small and so does not require much chip space, which, as is well known is a major expense in chip manufacture. As set out earlier, the thermal actuator of this invention is capable of extremely rapid operation, which has been a surprising and desirable result for the Applicant.

Another advantage of the thermal actuator is that it is well suited for use with the voltages and currents generally applied in integrated circuit technology.

We claim:

1. A nozzle arrangement for an ink jet printhead, the nozzle arrangement comprising a substrate; and
    an actuator that is arranged on the substrate for ejecting ink from a nozzle chamber of the nozzle arrangement, the actuator comprising
        at least one actuating member having an anchored portion that is anchored to the substrate and a working portion that is movable with respect to the substrate, the, or each, actuating member incorporating a material having a coefficient of thermal expansion so that when heated, the, or each, working portion is capable of expansion and consequent movement sufficient to perform work; and
        at least one heating device that is positioned in, and in contact with, the, or each respective, working portion to heat the, or each, working portion.

2. A nozzle arrangement as claimed in claim 1, which is manufactured in accordance with an integrated circuit fabrication technique so that the nozzle arrangement defines a micro electro-mechanical system.

3. A nozzle arrangement as claimed in claim 2, in which the substrate incorporates a wafer substrate and a drive circuitry layer positioned on the wafer substrate, the, or each, heating device being connected to drive circuitry within the drive circuitry layer.

4. A nozzle arrangement as claimed in claim 1, in which the, or each, working portion is flexible and the, or each, heating device is positioned in the, or each respective, working portion so that said material is unevenly heated, resulting in uneven expansion of said material and subsequent bending of the working portion.

5. A nozzle arrangement as claimed in claim 4, in which the, or each, heating device is in the form of a conductive heating element that is embedded in the, or each respective, working portion, in a position in which a greater mass of said material is positioned on a first side of the heating element than on an opposed second side so that expansion of said material on the second side of the heating element is greater than that on said first side, resulting in a bending of the working portion towards the first side.

6. A nozzle arrangement as claimed in claim 5, in which the, or each, heater element has a convoluted configuration to permit general expansion of the heater element together with said material.

7. A nozzle arrangement as claimed in claim 5, in which the actuator includes one actuating member that is elongate, with the anchor portion being positioned at one end of the actuating member and the working portion terminating at an opposed end of the actuating member.

8. A nozzle arrangement as claimed in claim 5, in which the actuator includes a number of actuating members that are positioned on the substrate in a complementary manner to achieve the ejection of ink from the nozzle chamber.

9. A nozzle arrangement as claimed in claim 1, in which said material is resiliently flexible so that the material is able to return to a starting condition upon cooling, subsequent to thermally driven expansion.

10. A nozzle arrangement as claimed in claim 9, in which said material has a coefficient of thermal expansion greater than $5 \times 10^{-6}$.

11. A nozzle arrangement as claimed in claim 10, in which said material has a Young's Modulus of greater than one gigapascal.

12. A nozzle arrangement for an ink jet printhead, the nozzle arrangement comprising
    a substrate; and
    an actuator that is arranged on the substrate for ejecting ink from a nozzle chamber of the nozzle arrangement, the actuator comprising
        at least one actuating member having an anchored portion that is anchored to the substrate and an end portion that is movable with respect to the substrate, the, or each, actuating member incorporating a material having a coefficient of thermal expansion so that when heated, the, or each, actuating member is capable of expansion with consequent movement of the end portion being sufficient to perform work; and a heating device that is operatively positioned with respect to the, or each, actuating member to heat the, or each, actuating member.

13. An ink jet printhead that comprises a substrate; and at least one nozzle arrangement that is arranged on the substrate, the, or each, nozzle arrangement comprising an actuator that is arranged on the substrate for ejecting ink from a nozzle chamber of the nozzle arrangement, the actuator comprising
- at least one actuating member having an anchored portion that is anchored to the substrate and a working portion that is movable with respect to the substrate, the, or each, actuating member incorporating a material having a coefficient of thermal expansion so that when heated, the, or each, working portion is capable of expansion and consequent movement sufficient to perform work; and
- at least one heating device that is positioned in, and in contact with, the, or each respective, working portion to heat the working portion.

14. An ink jet printhead that comprises a substrate; and at least one nozzle arrangement that is arranged on the substrate, the, or each, nozzle arrangement comprising an actuator that is arranged on the substrate for ejecting ink from a nozzle chamber of the nozzle arrangement, the actuator comprising
- at least one actuating member having an anchored portion that is anchored to the substrate and an end portion that is movable with respect to the substrate, the, or each, actuating member incorporating a material having a coefficient of thermal expansion so that when heated, the, or each, actuating member is capable of expansion with consequent movement of the end portion being sufficient to perform work; and
- a heating device that is operatively positioned with respect to the, or each, actuating member to heat the, or each, actuating member.

* * * * *